(12) United States Patent
Vuong et al.

(10) Patent No.: US 7,394,554 B2
(45) Date of Patent: Jul. 1, 2008

(54) SELECTING A HYPOTHETICAL PROFILE TO USE IN OPTICAL METROLOGY

(75) Inventors: Vi Vuong, Fremont, CA (US); Junwei Bao, Santa Clara, CA (US); Srinivas Doddi, Fremont, CA (US); Emmanuel Drege, San Jose, CA (US); Jin Wen, Sunnyvale, CA (US); Sanjay Yedur, San Jose, CA (US); Doris Chin, Milpitas, CA (US); Nickhil Jakatdar, Los Altos, CA (US); Lawrence Lane, San Jose, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 875 days.

(21) Appl. No.: 10/663,300

(22) Filed: Sep. 15, 2003

(65) Prior Publication Data

US 2005/0057748 A1    Mar. 17, 2005

(51) Int. Cl.
*G01B 11/00* (2006.01)
(52) U.S. Cl. .................... 356/625; 356/445; 356/237.2; 356/237.5
(58) Field of Classification Search .................. 356/237
See application file for complete search history.

(56) References Cited

U.S. PATENT DOCUMENTS

| | | | | |
|---|---|---|---|---|
| 5,963,329 A | * | 10/1999 | Conrad et al. ............... | 356/613 |
| 6,591,405 B1 | * | 7/2003 | Doddi ............................ | 716/7 |
| 6,785,638 B2 | | 8/2004 | Niu | |
| 6,891,626 B2 | | 5/2005 | Niu | |
| 6,943,900 B2 | * | 9/2005 | Niu et al. ..................... | 356/625 |
| 6,952,818 B2 | * | 10/2005 | Ikeuchi ........................ | 430/311 |
| 7,092,110 B2 | | 8/2006 | Balasubramanian | |
| 2004/0017574 A1 | | 1/2004 | Vuong | |
| 2004/0017575 A1 | * | 1/2004 | Balasubramanian et al. | 356/625 |
| 2004/0267397 A1 | | 12/2004 | Doddi | |

FOREIGN PATENT DOCUMENTS

| | | | |
|---|---|---|---|
| JP | 2001337047 | * | 7/2001 |
| JP | 2003059991 | * | 2/2003 |

* cited by examiner

*Primary Examiner*—Layla G. Lauchman
*Assistant Examiner*—Rebecca C Slomski
(74) *Attorney, Agent, or Firm*—Morrison & Foerster LLP (57) ABSTRACT

A hypothetical profile is used to model the profile of a structure formed on a semiconductor wafer to use in determining the profile of the structure using optical metrology.

To select a hypothetical profile, sample diffraction signals are obtained from measured diffraction signals of structures formed on the wafer, where the sample diffraction signals are a representative sampling of the measured diffraction signals. A hypothetical profile is defined and evaluated using a sample diffraction signal from the obtained sample diffraction signals.

32 Claims, 5 Drawing Sheets

SELECTING A HYPOTHETICAL PROFILE TO USE IN OPTICAL METROLOGY

BACKGROUND

1. Field of the Invention

The present application relates to integrated circuit (IC) metrology and more particularly to selecting a hypothetical profile for optical metrology.

2. Related Art

With the current drive towards smaller geometries of IC features, feature measurement is increasingly difficult as the size of the features becomes smaller. However, knowledge of the dimensions of gratings or periodic structures is essential in order to determine if the dimensions of the features are within the acceptable ranges and if, for example, a particular fabrication process causes the sidewalls of the features to be tapered, vertical, T-topped, undercut, or have footings.

Traditionally, a sample was cleaved and examined with a scanning electron microscope (SEM) or similar device. The cross-section SEM method is typically slow, expensive, and destructive, whereas the critical dimension (CD) SEM method only provides one measurement number seen from the top of the feature. Spectroscopic reflectometry and ellipsometry are used to beam light on the structure and measure the reflected beam. One application uses an empirical approach, where the spectra of reflected light are measured for a known width of features in a structure. This process is time consuming and expensive, even for a limited library of profiles of structure dimensions and the associated spectrum data of reflected/diffraction light. Furthermore, there is also a need for faster determination of CD's for in-line integrated metrology applications. Additionally, as the resolution of the library increases, the size of the library increases, while the time to create and use the library increases exponentially.

One technique for creating a library of diffraction signals and associated profiles of the integrated circuit structure involves the use of a hypothetical profile of the structure to calculate a simulated diffraction signal. The length of time needed to create a library using this approach varies depending on the hypothetical profile used and the number of parameters used to represent the hypothetical profile. Typically, the more complicated the hypothetical profile and the more parameters used, the more time and/or computing resources are needed.

SUMMARY

In one exemplary embodiment, a hypothetical profile is used to model the profile of a structure formed on a semiconductor wafer to use in determining the profile of the structure using optical metrology. To select a hypothetical profile, sample diffraction signals are obtained from measured diffraction signals of structures formed on the wafer, where the sample diffraction signals are a representative sampling of the measured diffraction signals. A hypothetical profile is defined and evaluated using a sample diffraction signal from the obtained sample diffraction signals.

DESCRIPTION OF DRAWING FIGURES

The present invention can be best understood by reference to the following description taken in conjunction with the accompanying drawing figures, in which like parts may be referred to by like numerals.

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
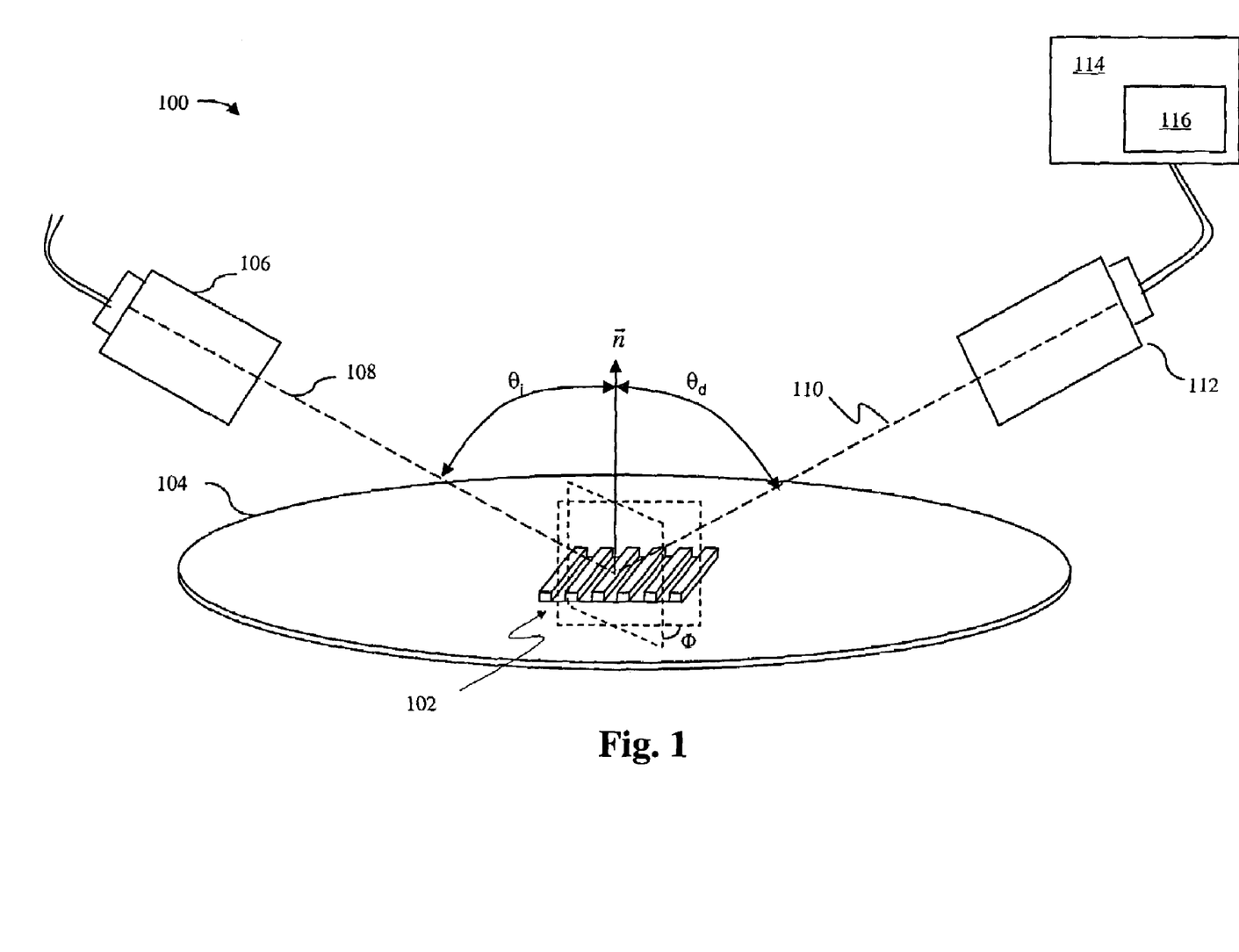
FIG. 1 depicts an exemplary optical metrology device.

With reference to FIG. 1, an optical metrology system 100 can be used to examine and analyze a structure formed on a semiconductor wafer. For example, optical metrology system 100 can be used to determine the profile of a periodic grating 102 formed on wafer 104. Periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104.

As depicted in FIG. 1, optical metrology system 100 can include a photometric device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal $\vec{n}$ of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal $\vec{n}$ and is received by detector 112. Detector 112 converts the diffracted beam 110 into a measured diffraction signal.

To determine the profile of periodic grating 102, optical metrology system 100 includes a processing module 114 configured to receive the measured diffraction signal and analyze the measured diffraction signal. As described below, the profile of periodic grating 102 can then be determined using a library-based process or a regression-based process. Additionally, other linear or non-linear profile extraction techniques are contemplated.

2. Library-based Process of Determining Profile of Structure

In a library-based process of determining the profile of a structure, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, after obtaining a measured diffraction signal, processing module 114 then compares the measured diffraction signal to simulated diffraction signals stored in a library 116. Each simulated diffraction signal in library 116 can be associated with a hypothetical profile. Thus, when a match is made between the measured diffraction signal and one of the simulated diffraction signals in library 116, the hypothetical profile associated with the matching simulated diffraction signal can be presumed to represent the actual profile of periodic grating 102.

The set of hypothetical profiles stored in library 116 can be generated by characterizing a hypothetical profile using a set of parameters, then varying the set of parameters to generate hypothetical profiles of varying shapes and dimensions. The process of characterizing a profile using a set of parameters can be referred to as parameterizing.

Figure 2A:
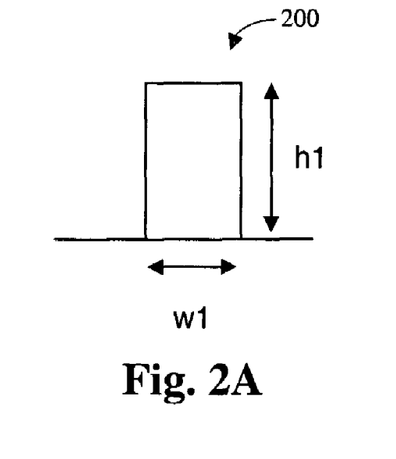
FIG. 2 depicts exemplary hypothetical profiles used to model the profile of a structure being examined.
Figure 2B:
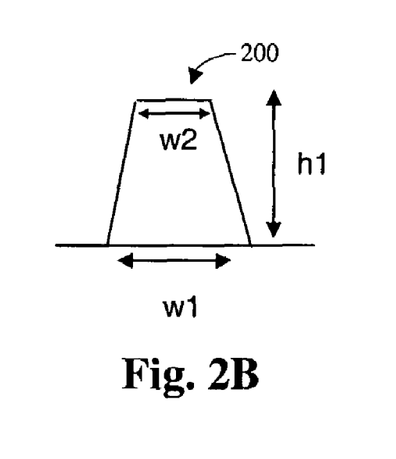
Figure 2C:
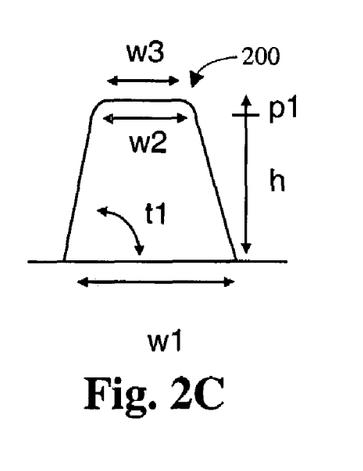
Figure 2D:
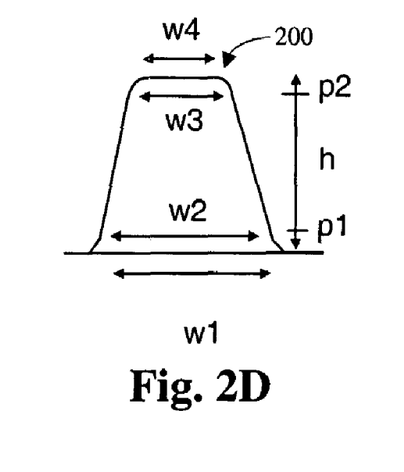
Figure 2E:
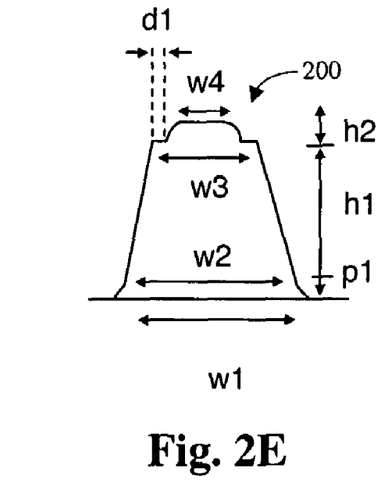

For example, as depicted in FIG. 2A, assume that hypothetical profile 200 can be characterized by parameters h1 and w1 that define its height and width, respectively. As depicted in FIGS. 2B to 2E, additional shapes and features of hypothetical profile 200 can be characterized by increasing the number of parameters. For example, as depicted in FIG. 2B, hypothetical profile 200 can be characterized by parameters h1, w1, and w2 that define its height, bottom width, and top width, respectively. Note that the width of hypothetical profile 200 can be referred to as the critical dimension (CD). For example, in FIG. 2B, parameters w1 and w2 can be described as defining the bottom CD and top CD, respectively, of hypothetical profile 200.

As described above, the set of hypothetical profiles stored in library 116 (FIG. 1) can be generated by varying the parameters that characterize the hypothetical profile. For example, with reference to FIG. 2B, by varying parameters h1, w1, and w2, hypothetical profiles of varying shapes and dimensions can be generated. Note that one, two, or all three parameters can be varied relative to one another.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of parameters and the increment at which the set of parameters are varied. In one exemplary embodiment, the hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using atomic force microscope (AFM), X-SEM, and the like.

For a more detailed description of a library-based process, see U.S. patent application Ser. No. 09/907,488, titled GENERATION OF A LIBRARY OF PERIODIC GRATING DIFFRACTION SIGNALS, filed on Jul. 16, 2001, which is incorporated herein by reference in its entirety.

3. Regression-based Process of Determining Profile of Structure

In a regression-based process of determining the profile of a structure, the measured diffraction signal is compared to a simulated diffraction signal (i.e., a trial diffraction signal). The simulated diffraction signal is generated prior to the comparison using a set of parameters (i.e., trial parameters) for a hypothetical profile (i.e., a hypothetical profile). If the measured diffraction signal and the simulated diffraction signal do not match or when the difference of the measured diffraction signal and one of the simulated diffraction signals is not within a preset or matching criterion, another simulated diffraction signal is generated using another set of parameters for another hypothetical profile, then the measured diffraction signal and the newly generated simulated diffraction signal are compared. When the measured diffraction signal and the simulated diffraction signal match or when the difference of the measured diffraction signal and one of the simulated diffraction signals is within a preset or matching criterion, the hypothetical profile associated with the matching simulated diffraction signal is presumed to represent the actual profile of the structure. The matching simulated diffraction signal and/or hypothetical profile can then be utilized to determine whether the structure has been fabricated according to specifications.

Thus, with reference again to FIG. 1, in one exemplary embodiment, processing module 114 can generate a simulated diffraction signal for a hypothetical profile, and then compare the measured diffraction signal to the simulated diffraction signal. As described above, if the measured diffraction signal and the simulated diffraction signal do not match or when the difference of the measured diffraction signal and one of the simulated diffraction signals is not within a preset or matching criterion, then processing module 114 can iteratively generate another simulated diffraction signal for another hypothetical profile. In one exemplary embodiment, the subsequently generated simulated diffraction signal can be generated using an optimization algorithm, such as global optimization techniques, which includes simulated annealing, and local optimization techniques, which includes steepest descent algorithm.

In one exemplary embodiment, the simulated diffraction signals and hypothetical profiles can be stored in a library 116 (i.e., a dynamic library). The simulated diffraction signals and hypothetical profiles stored in library 116 can then be subsequently used in matching the measured diffraction signal.

For a more detailed description of a regression-based process, see U.S. patent application Ser. No. 09/923,578, titled METHOD AND SYSTEM OF DYNAMIC LEARNING THROUGH A REGRESSION-BASED LIBRARY GENERATION PROCESS, filed on Aug. 6, 2001, which is incorporated herein by reference in its entirety.

4. Hypothetical Profile Generation

As described above, in the library-based process and regression-based process, the actual profile of the structure being examined is modeled using a hypothetical profile. As also described above, the hypothetical profile can be characterized using any number of parameters. The accuracy of the hypothetical profile can be increased by increasing the number of parameters. However, increasing the number of parameters can result in a larger library and/or increased processing time.

For example, with reference to FIGS. 2A and 2B, a hypothetical profile with three parameters (e.g., h1, w1, and w2 in FIG. 2B) can be more accurate than a hypothetical profile with two parameters (e.g., h1 and w1 in FIG. 2A). However, in a library-based process, the hypothetical profile with three parameters requires a library with an additional dimension in comparison to the hypothetical profile with two parameters. More particularly, the library for the hypothetical profile with two parameters (in this example, h1 and w1) includes an h1 dimension, which corresponds to the h1 parameter varied over a range, and a w1 dimension, which corresponds to the w1 parameter varied over a range. In contrast, the library for the hypothetical profile with three parameters (in this example, h1, w1, and w2) also includes a w2 dimension, which corresponds to the w2 parameter varied over a range.

Thus, if the actual profile of the structure being examined can be modeled using two parameters, then using three parameters will result in a library that is unnecessarily large. However, if the actual profile of the structure being examined cannot be modeled using two parameters, then using only two parameters will result in a library that may not provide sufficient accuracy.

Similarly, in a regression-based process, if the actual profile of the structure being examined can be modeled using two parameters, then using three parameters will result in unnecessary processing, such as adjusting parameters that do not need to be adjusted in order to determine a sufficient match. However, if the actual profile of the structure being examined cannot be modeled using two parameters, then using only two parameters may result in an insufficient match.

Figure 3:
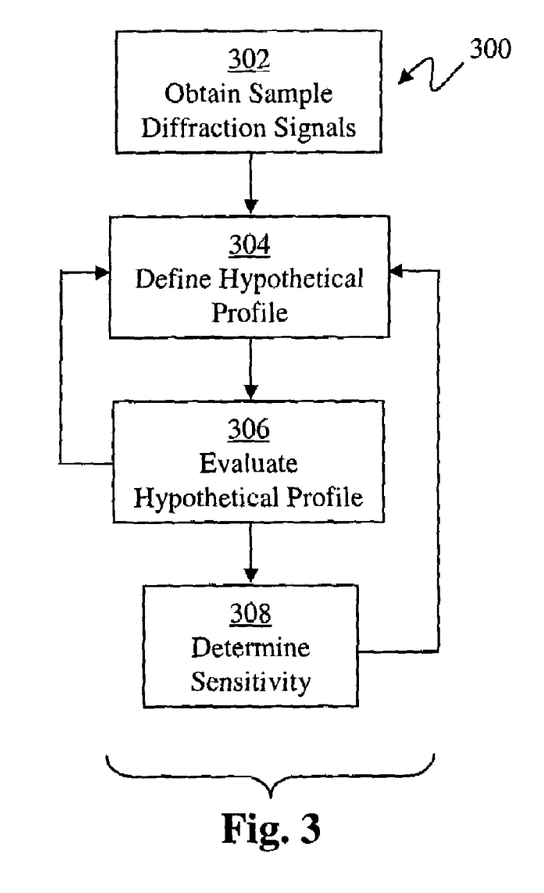
FIG. 3 depicts an exemplary process to select a hypothetical profile to use in examining a structure.

Thus, with reference to FIG. 3, an exemplary process 300 is depicted for selecting a hypothetical profile to use in characterizing a structure to be examined. In one exemplary embodiment, exemplary process 300 is a workflow that a user is instructed to follow in selecting a hypothetical profile to use in characterizing a structure to be examined. It should be recognized that exemplary process 300 can be implemented as a computer program running on a processing module, which can be processing module 114 (FIG. 1) or a separate processing module.

In 302, sample diffraction signals are obtained. In one exemplary embodiment, prior to performing process 300, measured diffraction signals are obtained from a production environment. The measured diffraction signals can be obtained using a photometric device (FIG. 1) to measure diffraction signals of structures formed on a wafer, which were fabricated in the production environment. In the present exemplary embodiment, the profiles of the structures are also obtained. The profiles can be obtained using various metrology techniques, such as AFM, X-SEM, and the like. The measured diffraction signals and corresponding profiles characterize the variation in the fabrication of the structures on the wafer. The number of measured diffraction signals and profiles can be relatively large. For example, a standard 300 millimeter wafer can have hundreds of dies, and thus measured diffraction signals and profiles can be obtained from thousands of combinations of locations. Thus, the sample diffraction signals are a representative sampling of the measured diffraction signals.

Figure 4:
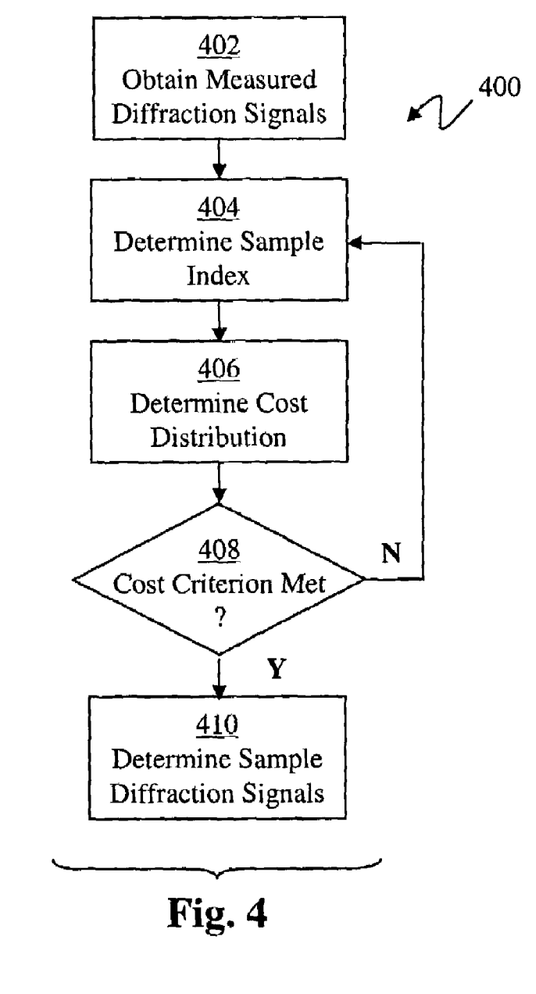
FIG. 4 depicts an exemplary process to obtain sample diffraction signals.

With reference to FIG. 4, an exemplary process 400 is depicted for obtaining sample diffraction signals. As noted above, the sample diffraction signals are a representative sampling of measured diffraction signals from a production environment. To accurately represent the measured diffraction signals, exemplary process 400 searches for the minimum number of sample diffraction signals with maximum, almost equal spacing. Note that if the number of measured diffraction signals is relatively small, such as 2 or even just 1, then process 400 can be omitted.

In 402, measured diffraction signals are obtained. In 404, a sample index is determined. The sample index corresponds to the spacing between the sample diffraction signals. In 406, a cost distribution associated with the sample index is determined based on the sample diffraction signals corresponding to the sample index. In 408, the determined cost distribution is compared to a cost criterion to determine if the cost criterion has been met.

As depicted in FIG. 4, if the cost criterion is not met, then another sample index is determined. More particularly, in the present exemplary embodiment, the sample index is increased, which corresponds to increasing the number of sample diffraction signals and decreasing the spacing between the sample diffraction signals.

If the cost criterion is met, then in 410 the sample diffraction signals are determined. More particularly, the sample index determined in 404 corresponds to the measured diffraction signals selected as the sample diffraction signals.

In one exemplary embodiment, the cost criterion used in 408 can be a relative criterion. For example, the percentage change in the cost distribution when 404 and 406 are iterated can be used as the cost criterion. More particularly, when 404 and 406 are iterated, a maximum cost distribution is recorded and maintained. The cost criterion can be a percentage, such as 0.5%, of the maximum cost distribution. Thus, 404 and 406 are iterated until the change in the cost distribution is less than 0.5% of the maximum cost distribution.

Alternatively, the cost criterion used in 408 can be a fixed criterion. For example, the cost criterion can be a fixed quantity, which can depend on the type of photometric device (FIG. 1) used to obtain the measured diffraction signals.

With reference again to FIG. 3, in 304, a hypothetical profile is defined to characterize the profile of the structure to be examined. As described above, the hypothetical profile includes parameters that characterize the shape of the profile of the structure to be examined. In 306, the hypothetical profile defined in 304 is evaluated based on the sample diffraction signals obtained in 302.

Figure 5:
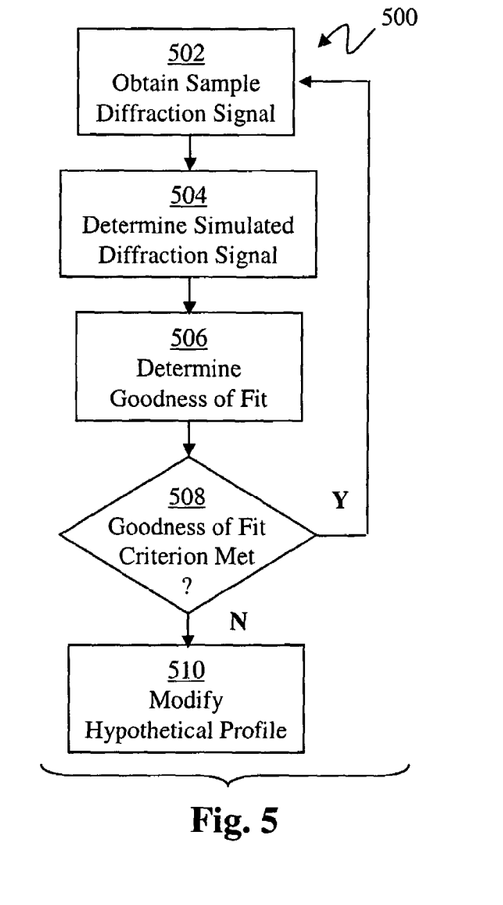
FIG. 5 depicts an exemplary process to optimize a hypothetical profile.

With reference to FIG. 5, an exemplary process 500 is depicted for evaluating the hypothetical profile defined in 304 (FIG. 3). In 502, a sample diffraction signal is obtained from the sample diffraction signals obtained in 302 (FIG. 3). In one exemplary embodiment, the sample diffraction signal obtained in 502 is the diffraction signal closest to the center of the range of sample diffraction signals obtained in 302 (FIG. 3). In 504, a simulated diffraction signal corresponding to the sample diffraction signal obtained in 502 can be determined using regression. For a more detailed description of optimizing a defined hypothetical profile, see U.S. patent application Ser. No. 09/907,448, titled GENERATION OF A LIBRARY OF PERIODIC GRATING DIFFRACTION SIGNALS, filed on Jul. 16, 2001, which is incorporated herein by reference in its entirety.

The simulated diffraction signal in 504 can be generated using a modeling technique, such as rigorous coupled wave analysis (RCWA), integral method, Fresnel method, finite analysis, modal analysis, and the like. For a detailed description of RCWA, see U.S. patent application Ser. No. 09/770,997, titled CACHING OF INTRA-LAYER CALCULATIONS FOR RAPID RIGOROUS COUPLED-WAVE ANALYSES, filed on Jan. 25, 2001, which is incorporated herein by reference in its entirety. The simulated diffraction signal can also be generated using a machine learning system. For a more detailed description of a machine learning system, see U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is incorporated herein by reference in its entirety.

With continued reference to FIG. 5, in 506 a goodness of fit (GOF) is determined based on the sample diffraction signal and the simulated diffraction signal. It should be recognized that GOF is referenced here as an example of a metric comparing signals. Other such metric include costs, sum-squared error, and the like, and can be used instead of or in addition to GOF. In 508, the GOF determined in 506 is compared to a GOF criterion to determine if the GOF criterion has been met.

As depicted in FIG. 5, if the GOF criterion has not been met, then in 510 the hypothetical profile is modified. More particularly, 510 in FIG. 5 can correspond to iterating 304 from 306 as depicted in FIG. 3. Thus, a new hypothetical profile can be defined until the GOF criterion is met.

As also depicted in FIG. 5, if the GOF criterion has been met, process 500 can be repeated for another sample diffraction signal to confirm the stability of the hypothetical profile, meaning that consistent results are obtained using the hypothetical profile. In this manner, all of the diffraction signals in the sample diffraction signals obtained in 302 (FIG. 3) can be evaluated using process 500. It should be recognized, however, that process 500 need not be iterated. Instead, when the GOF criterion has been met, with reference to FIG. 3, process 300 can proceed to 308 from 306.

Figure 6:
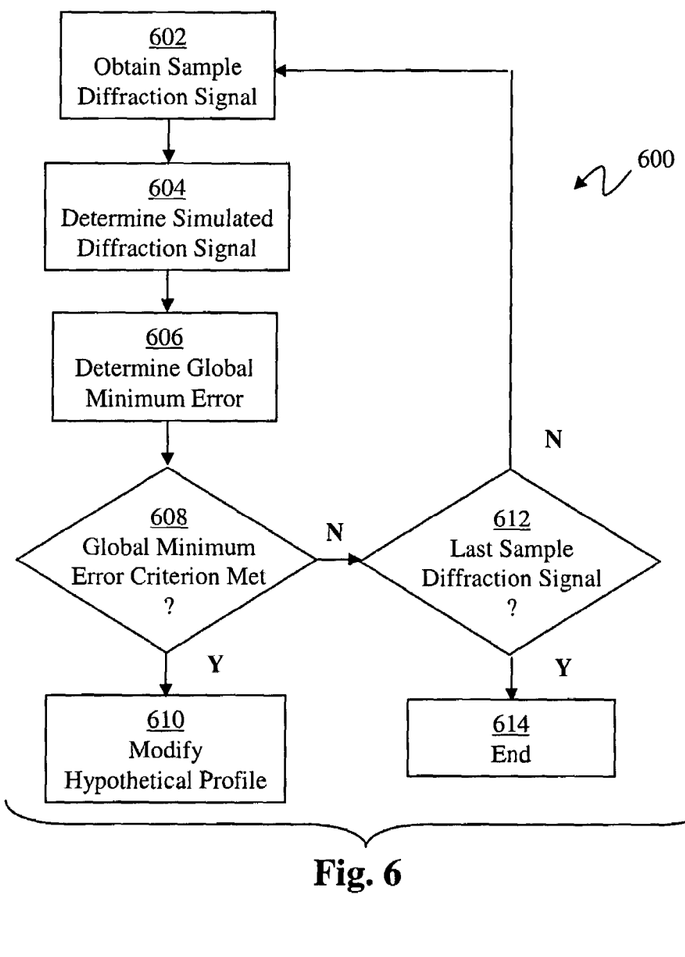
FIG. 6 depicts another exemplary process to optimize a hypothetical profile.

With reference to FIG. 6, another exemplary process 600 is depicted for evaluating the hypothetical profile defined in 304 (FIG. 3). In 602, a sample diffraction signal is obtained from the sample diffraction signals obtained in 302 (FIG. 3). In 604, a simulated diffraction signal is determined based on the sample diffraction signal. As noted above, the simulated diffraction signal can be generated using a modeling technique, such as rigorous coupled wave analysis (RCWA), integral method, Fresnel method, finite analysis, modal analysis, and the like, or a machine learning system.

In 606, a global minimum error (GME) is determined based on the sample diffraction signal and the simulated diffraction signal. In one exemplary embodiment, the GME is determined based on a comparison of the dimensions and/or features of the profile corresponding to the sample diffraction signal and the hypothetical profile that corresponds to the simulated diffraction signal. In 608, the GME determined in 606 is compared to a GME criterion to determine if the GME criterion has been met. In one exemplary embodiment, the GME criterion is a fixed amount, such as 30 nanometers.

As depicted in FIG. 6, if the GME criterion has been exceeded, then in 610 the hypothetical profile is modified. More particularly, 610 in FIG. 6 can correspond to iterating 304 from 306 as depicted in FIG. 3. Thus, a new hypothetical profile can be defined until the GME criterion is met.

As also depicted in FIG. 6, if the GME criterion has not been exceeded, process 600 can be repeated for another sample diffraction signal to confirm the stability of the hypothetical profile. More particularly, in 612, a determination is made as to whether the current sample diffraction signal is the last sample diffraction signal in the sample diffraction signals obtained in 302 (FIG. 3). If the current sample diffraction signal is not the last sample diffraction signal, then process 600 is repeated for another sample diffraction signal. If the current sample diffraction signal is the last sample diffraction signal, in 614, process 600 is terminated. More particularly, with reference to FIG. 3, process 300 can proceed to 308 from 306.

In process 600, the GME is used to confirm the stability of a hypothetical profile. It should be recognized, however, that if a hypothetical profile is known to be stable, then the GME can be used to evaluate the performance of one or more global search algorithms.

It should be recognized that process 500 (FIG. 5) and process 600 (FIG. 6) can be performed independently or in combination. For example, a user can be provided with an option to either perform process 500 or process 600. Alternatively, process 600 can be performed after performing process 600 or vice versa.

With reference to FIG. 3, in 308, a sensitivity analysis is performed based on the defined hypothetical profile to determine the sensitivity of the parameters that characterize the defined hypothetical profile. More particularly, in one exemplary embodiment, a simulated diffraction signal is generated for the defined hypothetical profile using a set of values for the parameters that characterize the defined hypothetical profile. Next, the values of one or more of the parameters that characterize the defined hypothetical profile are changed while keeping the other parameters constant. Another simulated diffraction signal is generated based on the changed values. The sensitivity of the one or more parameters that are changed is determined by comparing the two simulated diffraction signals. For example, the sensitivity of the one or more parameters can be expressed by calculating the sum-square-error (SSE) of the change in the simulated diffraction signals. For a more detailed description of determining the sensitivity of parameters that characterize a hypothetical profile, see U.S. patent application Ser. No. 10/206,491, titled MODEL AND PARAMETER SELECTION FOR OPTICAL METROLOGY, filed on Jul. 25, 2002, which is incorporated herein by reference in its entirety, and U.S. patent application Ser. No. 10/397,631, titled OPTIMIZED MODEL AND PARAMETER SELECTION FOR OPTICAL METROLOGY, filed on Mar. 25, 2003, which is incorporated herein by reference in its entirety.

As depicted in FIG. 3, if the determined sensitivity is not acceptable, then another hypothetical profile can be defined and 306 and 308 can be repeated for the new hypothetical profile. The determined sensitivity can be provided to the user for the user to determine if the determined sensitivity is acceptable. Alternatively, a sensitivity criterion can be defined to automatically determine if the determined sensitivity is acceptable.

5. Library Optimization

The hypothetical profile defined using process 300 (FIG. 3) can be used to generate a library in a library-based process to determine the unknown profile of a structure. More particularly, each parameter that characterizes the defined hypothetical profile can be varied over a range, and a simulated diffraction signal can be generated for each variation of the parameters of the defined hypothetical profile to generate the library of hypothetical profiles and simulated diffraction signals. In process 300 (FIG. 3), the sample diffraction signals are used to evaluate the stability of the defined hypothetical profile before using the defined hypothetical profile to generate a full library. The sample diffraction signals obtained in 302 can also be used to optimize the library.

Figure 7:
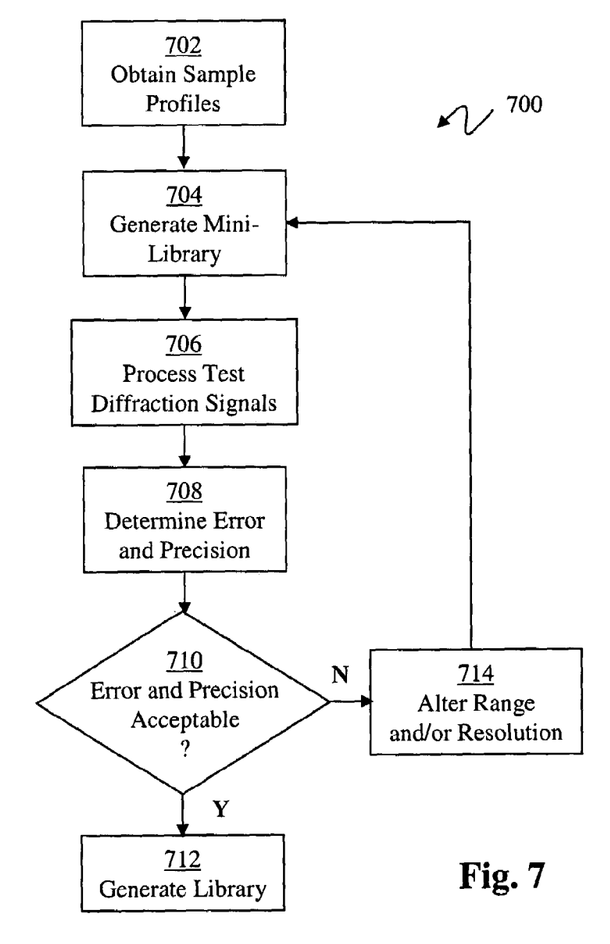
FIG. 7 depicts an exemplary process to optimize a library of simulated diffraction signals and hypothetical profiles.

In one exemplary embodiment, with reference to FIG. 7, an exemplary process 700 can be used to obtain error and precision estimates for a library before generating the full library. In 702, sample profiles, which correspond to the sample diffraction signals obtained in 302 (FIG. 3), are obtained. In 704, mini-libraries are generated based on the sample diffraction signals obtained in 702. More particularly, each sample diffraction signal corresponds to a set of values of the profile parameters. Each profile parameter is varied over a small range centered around the value of the parameter corresponding to the sample diffraction signal. Similar to the process of generating a full library, the profile parameters are varied over their corresponding ranges using the corresponding results for each parameter to be used in the full library. However, a mini-library is smaller in size than the full library to be generated. In one exemplary embodiment, each mini-library includes 2 points per dimension, which corresponds to a parameter of the defined hypothetical profile. In 706, the mini-libraries are then used to process test diffraction signals.

In 708, estimated error and precision are determined based on the results of processing the test diffraction signals using the mini-libraries. More particularly, profile deviation from known sample diffraction signals and profiles can be used to estimate the library standard error using a standard error function, such as an STEYX function. In one exemplary embodiment, a set of sample diffraction signals are obtained, which are obtained from the same location on a wafer using the same photometric device. In this exemplary embodiment, the precision of a library is defined as 3 times the standard deviation of the set of sample diffraction signals.

In 710, a determination is made as to whether the error and precision are acceptable. For example, the determined error and precision can be provided to the user for the user to determine if the determined error and precision are acceptable. Alternatively, error and precision criterion can be defined to automatically determine if the determined error and precision are acceptable. In one exemplary embodiment, the error and precision criterion is approximately one order of magnitude less than the error associated with a photometric device to be used with the full library. For example, the error and precision criterion is approximately 1 nanometer when the error associated with the photometric device is approximately 5 nanometers.

As depicted in FIG. 7, if the determined error and precision are acceptable, in 712, the full library is generated. If the determined error and precision are not acceptable, in 714 the range and/or resolution of the library can be altered, then process 700 can be iterated starting at 704.

6. Determining Measurement Die Pattern

As noted above, a wafer can have hundreds of dies, and thus measured diffraction signals and profiles can be obtained from thousands of combinations of locations. The sample diffraction signals obtained in 302 (FIG. 3) is a representative sampling of measured diffraction signals obtained from a wafer.

In one exemplary embodiment, the locations on the wafer from which the sample diffraction signals are obtained can be used as a measurement die pattern. More particularly, when fabricated wafers are examined, the measurement die pattern can be used to determine the locations on the wafer that will be examined in advanced process control and process characterization.

For example, in a library-based process, measured diffraction signals are obtained from structures located on a wafer corresponding to the measurement die pattern. The measured diffraction signals are compared to the library of simulated diffraction signals to determine matching hypothetical profiles to determine the profiles of the structures.

Although exemplary embodiments have been described, various modifications can be made without departing from the spirit and/or scope of the present invention. Therefore, the present invention should not be construed as being limited to the specific forms shown in the drawings and described above.

We claim:

1. A method of selecting a hypothetical profile to model the profile of a structure formed on a semiconductor wafer to use in determining the profile of the structure using optical metrology, the method comprising;
    obtaining sample diffraction signals from measured diffraction signals of structures formed on the wafer, wherein the sample diffraction signals are a representative sampling of the measured diffraction signals;
    defining a hypothetical profile to model profiles of the structures formed on the wafer; and
    evaluating the hypothetical profile using a sample diffraction signal from the obtained sample diffraction signals, wherein obtaining sample diffraction signals comprises:
    obtaining measured diffraction signals, wherein the measured diffraction signals are obtained from a plurality of locations on the wafer;
    determining a sample index, wherein the sample index corresponds to a number and a spacing of the sample diffraction signals;
    determining a cost distribution associated with the determined sample index; and
    adjusting the sample index when the determined cost distribution does not meet a cost criterion.

2. The method of claim 1, wherein the cost criterion is a percentage change in the cost distribution or a fixed quantity.

3. The method of claim 1, wherein defining a hypothetical profile comprises:
    characterizing the hypothetical profile using two or more parameters.

4. The method of claim 1, wherein evaluating the hypothetical profile comprises:
    (a) accessing a sample diffraction signal from the obtained sample diffraction signals;
    (b) determining a simulated diffraction signal corresponding to the sample diffraction signal;
    (c) determining a goodness of fit between the sample diffraction signal and to simulated diffraction signal; and
    (d) modifying the hypothetical profile when the goodness of fit does not meet a goodness of fit criterion.

5. The method of claim 4, wherein steps (a), (b), (c), and (d) are repeated for each of the sample diffraction signals.

6. The method of claim 4, wherein the sample diffraction signal accessed in step (a) is closest to a center of a range of sample diffraction signals.

7. The method of claim 1, wherein evaluating the hypothetical profile comprises:
    (a) obtaining a sample diffraction signal;
    (b) determining a simulated diffraction signal corresponding to the sample diffraction signal;
    (c) determining a global minimum error; and (d) modifying the hypothetical profile when the global minimum error exceeds a global minimum error criterion.

8. The method of claim 7, wherein steps (a), (b), (c), and (d) are repeated for each of the sample diffraction signals.

9. The method of claim 7, wherein the global minimum error is used to evaluate the performance of one or more global search algorithms.

10. The method of claim 1, further comprising:
    determining sensitivity for one or more parameters that characterize the hypothetical profile; and
    modifying the hypothetical profile when the determined sensitivity is not acceptable or does not meet a sensitivity criterion.

11. The method of claim 1, further comprising:
    generating one or more mini-libraries based on the obtained sample diffraction signals, wherein a mini-library is smaller in size than a full library to be generated;
    processing test diffraction signals using the one or more mini-libraries; and
    estimating an avenged error and precision based on results of processing the test diffraction signals.

12. The method of claim 11, further comprising:
determining if the estimated averaged error and precision are acceptable; and
generating the full library when the estimated averaged error and precision are determined to be acceptable.

13. The method of claim 12, wherein determining if the estimated averaged error and precision are acceptable comprises:
providing the estimated avenged error and precision to a user.

14. The method of claim 12, wherein determining if the estimated averaged error and precision are acceptable comprises:
determining if the estimated averaged error and precision meet an error and precision criterion, wherein the precision criterion is approximately one order of magnitude less than the error associated with a photometric device to be used with the full library.

15. The method of claim 12, further comprising:
processing test diffraction signals using the generated full library; and
estimating an averaged error and precision for the full library based on results of processing the test diffraction signals.

16. The method of claim 12, further comprising:
altering the range and/or resolution of one or more parameters that characterize the hypothetical profile when the estimated averaged error and precision are not acceptable.

17. The method of claim 1, further comprising:
determining a measurement die pattern based on the sample diffraction signals, wherein each location in the measurement die pattern corresponds to each location on the wafer from which the sample diffraction signals were obtained.

18. The method of claim 17, wherein the measurement die pattern is used in advanced process control and process characterization.

19. A computer-readable storage medium containing computer executable code to select a hypothetical profile to model the profile of a structure formed on a semiconductor wafer to use in determining the profile of the structure using optical metrology by instructing a computer to operate as follows:
obtaining sample diffraction signals from measured diffraction signals of structures formed on the wafer, wherein the sample diffraction signals are a representative sampling of the measured diffraction signals;
defining a hypothetical profile to model profiles of the structures formed on the wafer; and
evaluating the hypothetical profile using a sample diffraction signal from the obtained sample diffraction signals,
wherein obtaining sample diffraction signals comprises:
obtaining measured diffraction signals, wherein the measured diffraction signals are obtained from a plurality of locations on the wafer;
determining a sample index, wherein the sample index corresponds to a number and a spacing of the sample diffraction signals;
determining a cost distribution associated with the determined sample index; and
adjusting the sample index when the determined cost distribution does not meet a cost criteron.

20. The computer-readable storage medium of claim 19, wherein evaluating the hypothetical profile comprises:
accessing a sample diffraction signal from the obtained sample diffraction signals;
determining a simulated diffraction signal corresponding to the sample diffraction signal;
determining a goodness of fit between the sample diffraction signal and the simulated diffraction signal; and
modifying the hypothetical profile when the goodness of fit does not meet a goodness of fit criterion.

21. The computer-readable storage medium of claim 19, wherein evaluating the hypothetical profile comprises:
accessing a sample diffraction signal from the obtained sample diffraction signals;
determining a simulated diffraction signal corresponding to the sample diffraction signal;
determining a global minimum error; and
modifying the hypothetical profile when the global minimum error exceeds a global minimum error criterion.

22. The computer-readable storage medium of claim 19, further comprising:
determining a sensitivity for one or more parameters that characterize the hypothetical profile; and
modifying the hypothetical profile when the determined sensitivity is not acceptable or does not meet a sensitivity criterion.

23. The computer-readable storage medium of claim 19, further comprising:
generating one or more mini-libraries based on the obtained sample diffraction signals, wherein a mini-library is smaller in size than a full library to be generated;
processing test diffraction signals using the one or more mini-libraries; and
estimating an averaged error and precision based on results of processing the test diffraction signals.

24. The computer-readable storage medium of claim 23, further comprising:
generating the full library when the estimated averaged error and precision are acceptable; and
altering the range and/or resolution of one or more parameters that characterize the hypothetical profile when the estimated averaged error and precision are not acceptable.

25. The computer-readable storage medium of claim 19, further comprising:
determining a measurement die pattern based on the sample diffraction signals, wherein each location in the measurement die pattern corresponds to each location on the wafer from which the sample diffraction signals were obtained.

26. A system to select a hypothetical profile to model the profile of a structure formed on a semiconductor wafer to use in determining the profile of the structure using optical metrology, the system comprising:
a photometric device configured to obtain measured diffraction signals from structures formed on the wafer; and
a processing module configured to:
obtain sample diffraction signals from the measured diffraction signals, wherein the sample diffraction signals are a representative sampling of the measured diffraction signals; and
evaluate a hypothetical profile using a sample diffraction signal from the obtained sample diffraction signals,
wherein the processing module is configured to obtain sample diffraction signals by:
determining a sample index, wherein the sample index corresponds to a number and a spacing of the sample diffraction signals;

determining a cost distribution associated with the determined sample index; and adjusting the sample index when the determined cost distribution does not meet a cost criterion.

27. The system of claim 26, wherein the processing module is configured to evaluate the hypothetical profile by:

accessing a sample diffraction signal from the obtained sample diffraction signals;

determining a simulated diffraction signal corresponding to the sample diffraction signal;

determining a goodness of fit between the sample diffraction signal and the simulated diffraction signal; and modifying the hypothetical profile when the goodness of fit does not meet a goodness of fit criterion.

28. The system of claim 26, wherein the processing module is configured to evaluate the hypothetical profile by:

accessing a sample diffraction signal from the obtained sample diffraction signals;

determining a simulated diffraction signal corresponding to the sample diffraction signal;

determining a global minimum error, and modifying the hypothetical profile when the global minimum error exceeds a global minimum error criterion.

29. The system of claim 26, wherein to processing module is further configured to determine sensitivity for one or more parameters that characterize the hypothetical profile.

30. The system of claim 26, wherein the processing module is further configured to:

generate one or more mini-libraries based on the obtained sample diffraction signals, wherein a mini-library is smaller in size than a full library to be generated;

process test diffraction signals using the one or more mini-libraries; and estimating an averaged error and precision based on results of processing the test diffraction signals.

31. The system of claim 30, wherein the processing module is further configured to:

generate a full library when the estimated averaged error and precision are acceptable; and alter the range and/or resolution of one or more parameters that characterize the hypothetical profile when the estimated averaged error and precision are not acceptable.

32. The system of claim 26, wherein the processing module is further configured to:

determine a measurement die pattern based on the sample diffraction signals, wherein each location in the measurement die pattern corresponds to each location on the wafer from which the sample diffraction signals were obtained.

* * * * *